United States Patent
Tsunematsu

(10) Patent No.: US 8,404,982 B2
(45) Date of Patent: Mar. 26, 2013

(54) ELECTRONIC APPARATUS

(75) Inventor: Terutoshi Tsunematsu, Kadoma (JP)

(73) Assignee: Panasonic Corporation, Kadoma-shi (JP)

( * ) Notice: Subject to any disclaimer, the term of this patent is extended or adjusted under 35 U.S.C. 154(b) by 379 days.

(21) Appl. No.: 12/904,162

(22) Filed: Oct. 14, 2010

(65) Prior Publication Data

US 2011/0088939 A1    Apr. 21, 2011

(30) Foreign Application Priority Data

Oct. 15, 2009   (JP) .................... 2009-238059

(51) Int. Cl.
*H05K 9/00* (2006.01)
(52) U.S. Cl. ......... 174/383; 361/693; 361/695; 454/184
(58) Field of Classification Search .................. 174/383; 454/184; 361/693, 695, 816, 818
See application file for complete search history.

(56) References Cited

U.S. PATENT DOCUMENTS

| | | | | |
|---|---|---|---|---|
| 5,030,793 A | * | 7/1991 | McCarthy | 174/383 |
| 5,698,818 A | * | 12/1997 | Brench | 174/385 |
| 5,928,076 A | * | 7/1999 | Clements et al. | 454/184 |
| 6,297,446 B1 | * | 10/2001 | Cherniski et al. | 174/383 |
| 6,411,102 B1 | * | 6/2002 | Gilliland et al. | 324/627 |
| 6,567,276 B2 | * | 5/2003 | Kopf et al. | 361/818 |
| 7,199,310 B2 | * | 4/2007 | Cochrane | 174/383 |
| 7,241,954 B2 | * | 7/2007 | Kanai | 174/383 |
| 2006/0196692 A1 | * | 9/2006 | Sakamoto et al. | 174/383 |

FOREIGN PATENT DOCUMENTS

JP       H05-259689 A     10/1993

* cited by examiner

*Primary Examiner* — Hung Ngo
(74) *Attorney, Agent, or Firm* — Judge Patent Associates

(57) ABSTRACT

An electronic apparatus includes: a housing 100 formed of a conductive material; and a digital processing circuit 102 which is disposed in the housing 100 and which radiates an electromagnetic wave. The housing 100 includes a ventilation part 101 through which air is ventilated into and out of the housing 100. The ventilation part 101 is divided into a plurality of holes by a conductive member. When a maximum length in one of the vertical direction and the horizontal direction of one of the plurality of holes that has the largest opening area is R m, and when the frequency of the electromagnetic wave radiated from the digital processing circuit 102 is A Hz, a relationship expressed as $3.0 \times 10^8 / A \times \frac{1}{2} > R$ is satisfied.

9 Claims, 10 Drawing Sheets

ELECTRONIC APPARATUS

INCORPORATION OF FOREIGN PRIORITY APPLICATION BY REFERENCE

The disclosure of Japanese Patent Application No. 2009-238059, filed on Oct. 15, 2009, is incorporated herein by reference.

BACKGROUND OF THE INVENTION

1. Field of the Invention

The present invention relates to an electronic apparatus including a high frequency noise source and a fan ventilation hole for controlling temperature, and in particular, to a configuration preferable for providing measures against radiation of high frequency noises.

2. Description of the Background Art

In recent years, video performance and audio performance of digital AV apparatuses have become substantially superior to those of analog apparatuses. Meanwhile, from a designing point of view, it is necessary to take measures against radiation of high frequency noises (electromagnetic waves) which are generated due to a high operating frequency of a digital processing circuit and data communications, and measures against heat generated from the digital processing circuit (e.g., LSI).

However, the two kinds of measures conflict with each other. In other words, it is preferable that the opening area of a fan ventilation hole for releasing heat is as large as possible in order to improve ventilation efficiency, and at the same time, is as small as possible in order to suppress the radiation of high frequency noises. Japanese Patent Laid-open Publication No. 5-259689 discloses a magnetic-shielding housing in which a magnetic-shielding board is disposed near a fan.

As described above, for an electronic apparatus, the measures against heat and the measures against radiation conflict with each other. In order to release the heat generated in the electronic apparatus, it is necessary to improve the ventilation efficiency. Therefore, it is preferable that the opening area of the fan ventilation hole is as large as possible. On the other hand, in order to suppress the radiation of high frequency noises generated in the electronic apparatus (radiation from the inside to the outside of the electronic apparatus), it is preferable that the opening area is as small as possible.

SUMMARY OF THE INVENTION

An object of the present invention is to provide an electronic apparatus which can improve ventilation efficiency and suppress radiation of electromagnetic waves (high frequency noise).

The present invention is an electronic apparatus including: a housing formed of a conductive material; and an electronic circuit which is disposed in the housing and which radiates an electromagnetic wave. The housing includes a ventilation part through which air is ventilated into and out of the housing. The ventilation part is divided into a plurality of holes by a conductive member. A maximum length in one of the vertical direction and the horizontal direction of one of the plurality of holes that has the largest opening area is less than the length of a half of the wavelength of the electromagnetic wave radiated from the electronic circuit, and the ventilation part does not suppress ventilation of air.

According to this configuration, since the half wavelength of the electromagnetic wave is greater than the maximum length of the holes of the ventilation part, it is possible to suppress the electromagnetic wave (the portion that is not attenuated) from being radiated to the outside of the electronic apparatus. On the other hand, a hole having the maximum length that can suppress the radiation of the electromagnetic wave is formed in the ventilation part. This hole does not reduce the ventilation performance and, thus, it is possible to improve the ventilation efficiency. Therefore, it is possible to improve ventilation efficiency while suppressing the radiation of the electromagnetic wave from the electronic apparatus.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
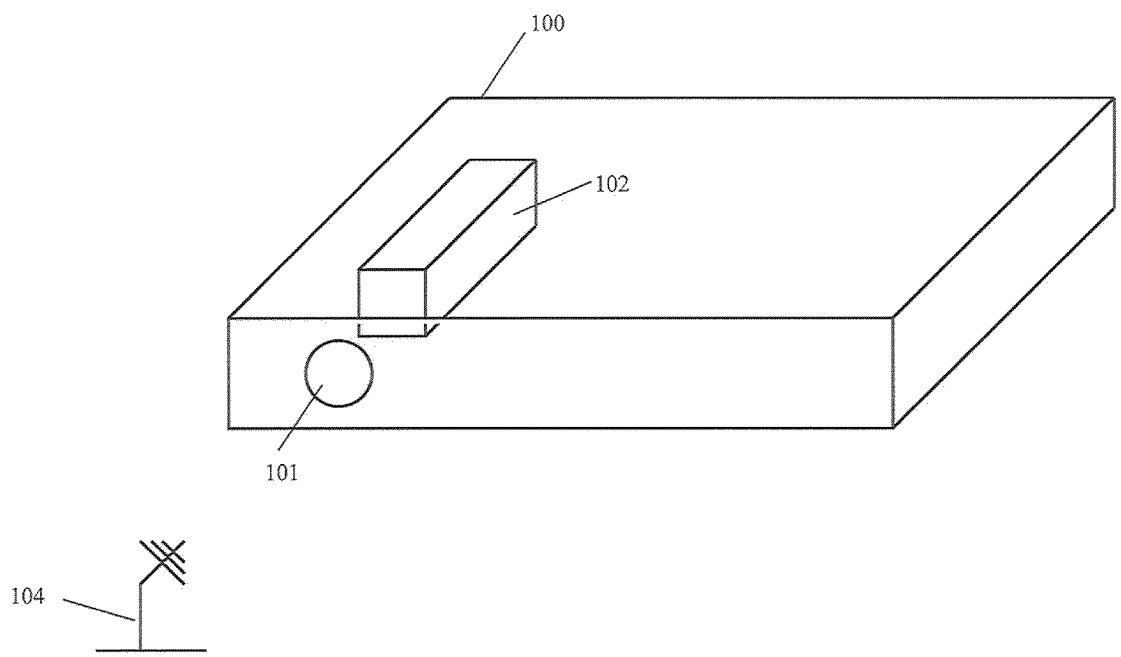
FIG. 1 shows a configuration of an electronic apparatus according to Embodiment 1 of the present invention.
Figure 2:
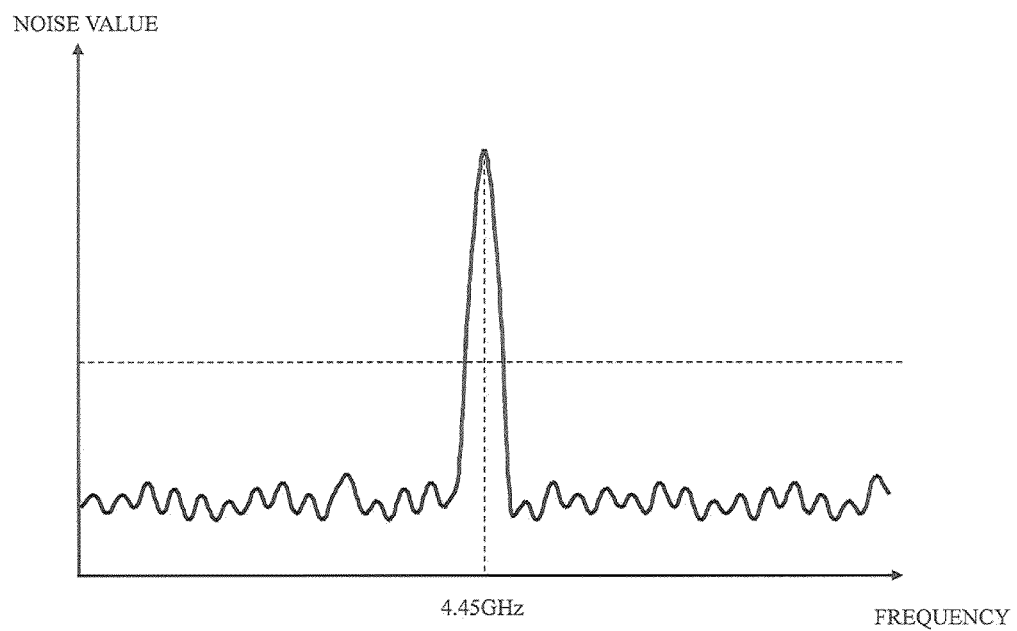
FIG. 2 shows an example of a high frequency noise generated in a digital processing circuit 102.

FIG. 1 shows a configuration of an electronic apparatus according to Embodiment 1 of the present invention. Hereinafter, an AV digital apparatus which is an example of an electronic apparatus will be described. In FIG. 1, a housing 100 of the AV digital apparatus includes a digital processing circuit 102 which digitally processes video signals and/or audio signals. On a side face of the housing 100, a ventilation part 101 is provided. The digital processing circuit 102 is an example of a generation source of a high frequency noise. In Embodiment 1, the digital processing circuit 102 generates a high frequency noise with a frequency of 4.45 GHz. FIG. 2 shows an example of the high frequency noise generated in the digital processing circuit 102. As shown in FIG. 2, the high frequency noise generated in the digital processing circuit 102 has a peak at 4.45 GHz and low noise values in other portions.

The ventilation part 101 is a hole provided in the housing 100 in order to release heat generated in the digital processing circuit 102 to the outside of the housing 100. Through the ventilation part 101, air can move from the inside of the housing 100 to the outside of the housing 100. Through the ventilation part 101, air can also move from the outside of the housing 100 to the inside of the housing 100. Moreover, a fan (not shown) for ventilation may be provided for the ventilation part 101.

Here, the housing 100 is formed of a conductive material (e.g., steel). Accordingly, the high frequency noise radiated from the digital processing circuit 102 is not radiated to the outside of the housing 100, except through the ventilation part 101.

Figure 5:
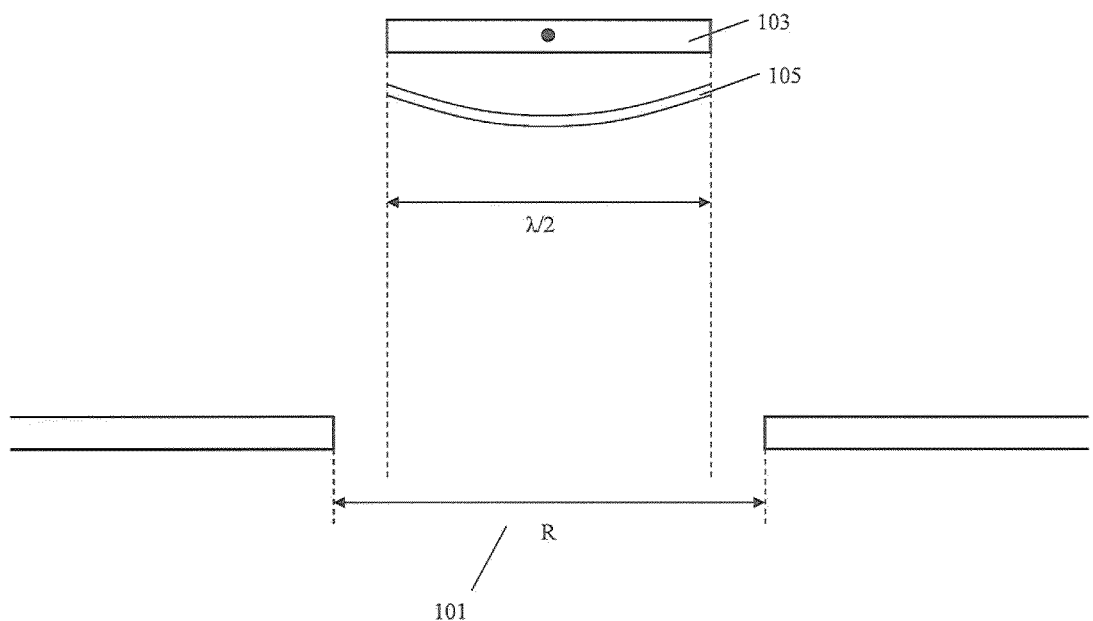
FIG. 5 illustrates a positional relationship between a virtual dipole antenna 103 and the ventilation part 101.

A log periodic antenna 104 measures a high frequency noise. FIG. 5 schematically shows a high frequency noise 105 being radiated from the digital processing circuit 102.

Figure 3:
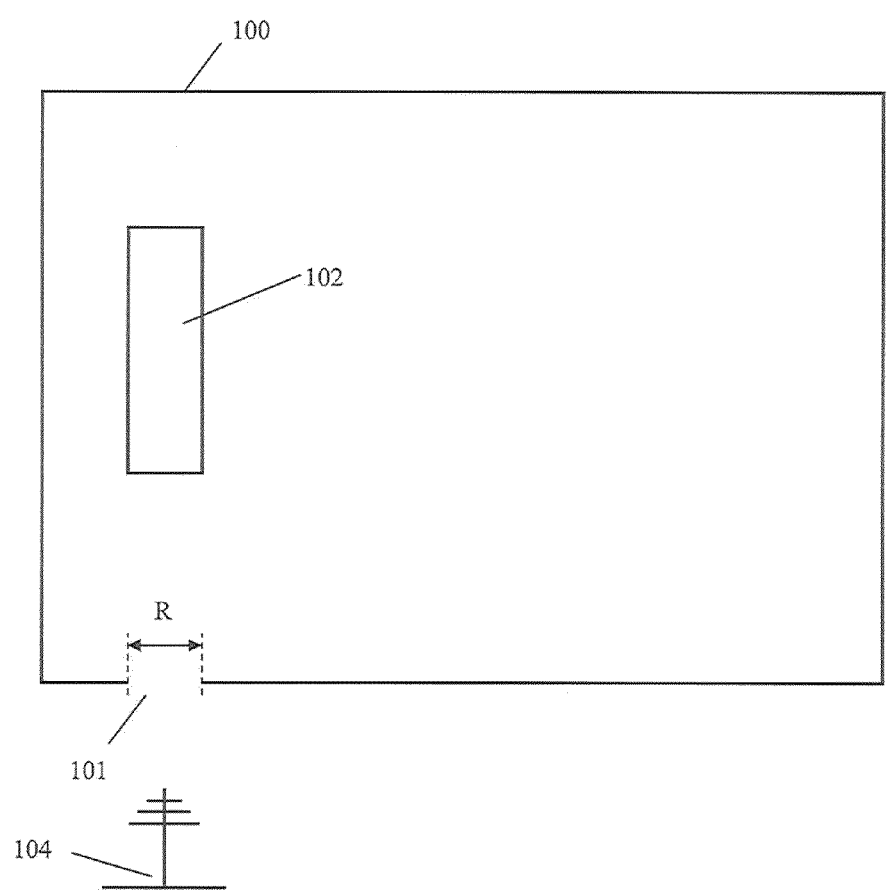
FIG. 3 shows a positional relationship between a ventilation part 101 and the digital processing circuit 102 shown in FIG. 1.

FIG. 3 shows a positional relationship between the ventilation part 101 and the digital processing circuit 102 when the AV digital apparatus is seen from above. As shown in FIG. 3, in Embodiment 1, the digital processing circuit 102 is disposed in front of the ventilation part 101. That is, the ventilation part 101 is provided, when seen from above, at a position facing a side of a quadrangle representing the digital processing circuit 102.

Figure 4:
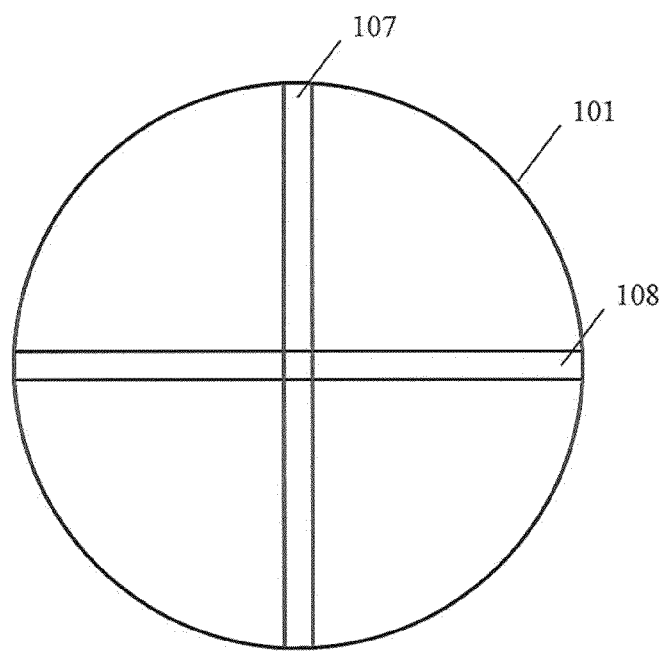
FIG. 4 shows a detailed configuration of the ventilation part 101.

FIG. 4 shows a detailed configuration of the ventilation part 101 of Embodiment 1. The ventilation part 101 includes a bar 107 and a bar 108. A "bar" herein is formed of a conductive material (e.g., steel). In Embodiment 1, it is assumed that the ventilation part 101 is circular, and the diameter thereof is 5 cm. Moreover, the bar 107 and the bar 108 are disposed through the center of the circle of the ventilation part 101, and perpendicularly intersect with each other. Therefore, the maximum length in the horizontal direction and the vertical direction of each hole in the ventilation part 101 is 2.5 cm.

In general, the wavelength of a high frequency noise (electromagnetic wave) is expressed as:

wavelength $\lambda m$=velocity of light $C$ m/s/frequency $F$ Hz, where the velocity of light $C=2.99792458\times10^8$ m/s.

In Embodiment 1, since the high frequency noise generated in the digital processing circuit 102 has a frequency of 4.45 GHz, the wavelength $\lambda$ is 6.74 cm. Meanwhile, when the high frequency noise with the wavelength $\lambda=6.74$ cm is generated from the digital processing circuit 102, if the maximum length of each hole of the ventilation part 101 is greater than a ½ wavelength of the wavelength $\lambda$ of the high frequency, the high frequency noise can pass through each hole of the ventilation part 101 without being attenuated, as widely known. Accordingly, when considering measures against the high frequency noise radiation through the ventilation part 101, it is important to take 3.37 cm, which is the value of the $\lambda$/2, into consideration. It is noted that a high frequency noise of which half wavelength is greater than the maximum length of each hole of the ventilation part 101 is attenuated when passing through each hole of the ventilation part 101. Accordingly, it is often unnecessary to take measures against such a noise.

Now, it is assumed that an electromagnetic wave generated in the digital processing circuit 102 is received by the log periodic antenna 104. When the electromagnetic wave generated in the digital processing circuit 102 is received by the log periodic antenna 104, it is necessary that the maximum length in the horizontal direction or the vertical direction (hereinafter, "the maximum length in the horizontal direction or the vertical direction" will be referred to merely as "the maximum length" when not followed by either of the horizontal direction or the vertical direction) of the space in each hole of the ventilation part 101 is greater than the wavelength (in particular, half wavelength) of the high frequency noise 105. In particular, in order for the log periodic antenna 104 to receive an electromagnetic wave, when the half wavelength of the high frequency noise 105 is 3.37 cm, it is necessary that the maximum length of the space in the hole of the ventilation part 101 be greater than 3.37 cm. On the other hand, when the maximum length of the space in the hole of the ventilation part 101 is less than the half wavelength of the high frequency noise 105, the electromagnetic wave received by the log periodic antenna 104 is attenuated (only attenuated electromagnetic wave passes through the ventilation part 101).

FIG. 5 shows a positional relationship between a virtual dipole antenna 103 and the ventilation part 101. In FIG. 5, the digital processing circuit 102, which is a noise source, is represented by the virtual dipole antenna 103. Since the digital processing circuit 102 generates the high frequency noise with the frequency of 4.45 GHz, the digital processing circuit 102 can be considered as an antenna which generates the high frequency noise with the frequency of 4.45 GHz. Thus, the digital processing circuit 102 is virtually considered as an antenna, and represented by the virtual dipole antenna 103. As described above, the virtual dipole antenna 103 is merely a virtual antenna, and does not actually exist as an antenna. The virtual dipole antenna 103 is merely used to facilitate description of the digital processing circuit 102 according to Embodiment 1. In FIG. 5, no bar is provided in the ventilation part 101.

In Embodiment 1, when the bar 107 and the bar 108 are provided as shown in FIG. 4, the maximum length of the space in the hole of the ventilation part 101 is 2.5 cm. Accordingly, it is possible to suppress the high frequency noise with the frequency of 4.45 GHz from being radiated to the outside of the housing 100. In addition, in this case, since the maximum length of the space in the hole of the ventilation part 101 is 2.5 cm, it is possible to suppress electromagnetic waves with a wavelength $\lambda$ that satisfies ½$\lambda$>2.5 cm from being radiated to the outside of the housing 100. In other words, it is possible to suppress high frequency noises with a frequency less than or equal to 6.00 GHz from being radiated to the outside of the housing 100.

As described above, in Embodiment 1, when the frequency of the high frequency noise generated from the digital processing circuit 102 is 4.45 GHz, and when the maximum length of the hole of the ventilation part 101 is 2.5 cm, it is possible to suppress the high frequency noise from being radiated to the outside of the housing 100. The relationship among the frequency of the high frequency noise, the maximum length of the hole of the ventilation part, and the wavelength of the high frequency noise in Embodiment 1 is expressed as follows.

It is assumed that the frequency of the high frequency noise is A Hz, and the maximum length of the hole of the ventilation part is R. In this case, the wavelength $\lambda$ of the high frequency noise is $2.99792458\times10^8/A$.

Here, if the maximum length R of the hole is less than $\lambda\times$½, it is possible to suppress the high frequency noise from being radiated to the outside of the housing 100. Therefore, when the following formula (1) is satisfied, it is possible to suppress the high frequency noise from being radiated to the outside of the housing 100.

$$2.99792458\times10^8/\text{frequency } A\times\tfrac{1}{2}>R \qquad \text{formula (1)}$$

That is, the electronic apparatus according to Embodiment 1 is an electronic apparatus including: the housing 100 formed of a conductive material; and the digital processing circuit 102 which is disposed in the housing 100 and which radiates an electromagnetic wave. The housing 100 includes the ventilation part 101 through which air is ventilated into and out of the housing 100. The ventilation part 101 is divided into a plurality of holes by a conductive member. When the maximum length in one of the vertical direction and the horizontal direction of the one of the plurality of holes that has the largest opening area is R m, and when the frequency of the electromagnetic wave radiated from the digital processing circuit 102 is A Hz, a relationship expressed as $3.0\times10^8/A\times\frac{1}{2}>R$ is satisfied.

In addition, a fan for ventilating air can be provided in the housing 100 of the AV digital apparatus, which is an electronic apparatus according to Embodiment 1.

As described above, in the housing 100 of the electronic apparatus according to Embodiment 1, the radiation of the high frequency noise from the ventilation part 101 can be suppressed by merely providing a conductive bar, instead of a mesh or the like which reduces ventilation efficiency. Accordingly, even when a fan or the like is provided near the ventilation part 101 to send air through the ventilation part 101, it is possible to suppress reduction of the ventilation efficiency and to suppress radiation of high frequency noise.

Embodiment 2

Figure 7:
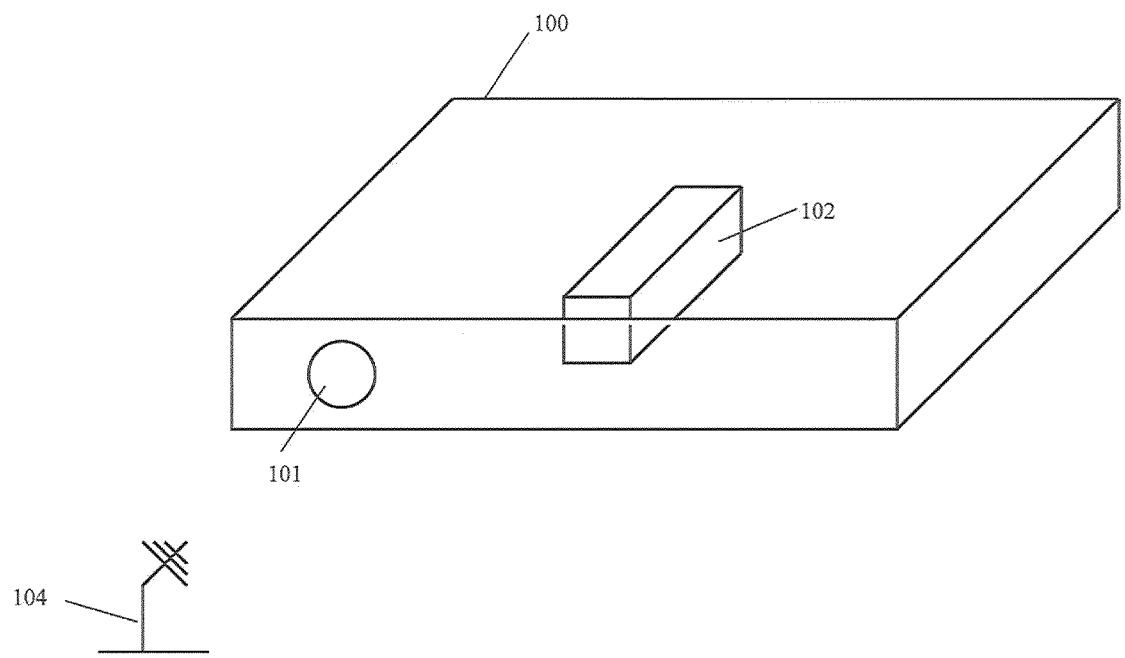
FIG. 7 shows a configuration of an electronic apparatus according to Embodiment 2 of the present invention.

FIG. 7 shows a configuration of an electronic apparatus according to Embodiment 2 of the present invention. Also in FIG. 7, the electronic apparatus is described as an AV digital apparatus. What is different from FIG. 1 is that the digital processing circuit 102, which is a high frequency noise source in the housing 100, is provided not in front of the ventilation part 101 but nearer to the center of the housing 100 than in FIG. 1. That is, the ventilation part 101 is not provided at the position facing a side of the quadrangle representing the digital processing circuit 102, when seen from above.

Since the housing 100, the ventilation part 101, the digital processing circuit 102, the virtual dipole antenna 103, the log periodic antenna 104, and the high frequency noise 105 are the same as those of Embodiment 1, the description thereof is omitted.

Figure 6:
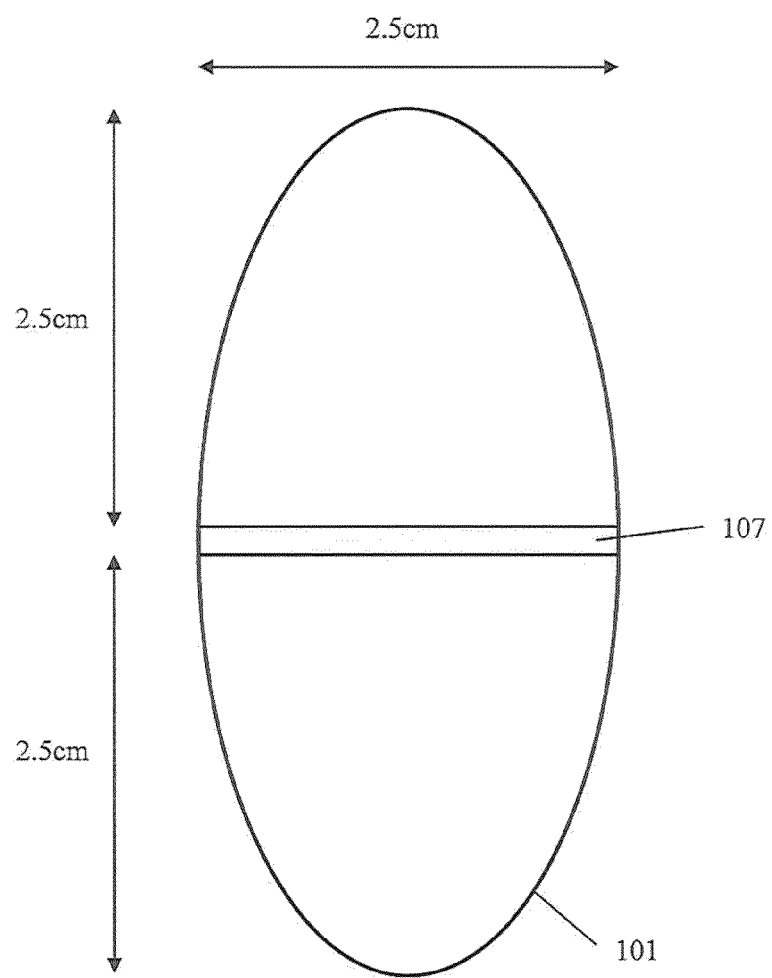
FIG. 6 shows dimensions of two holes in the ventilation part when the ventilation part 101 is seen from the virtual dipole antenna 103.
Figure 8:
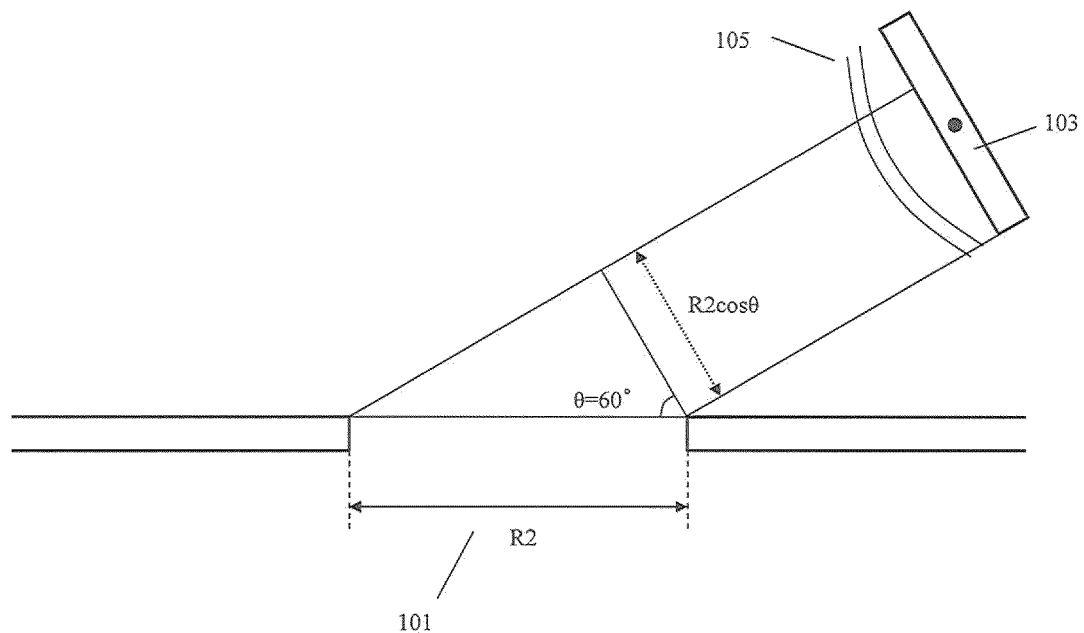
FIG. 8 illustrates a positional relationship between the virtual dipole antenna 103 and the ventilation part 101.

FIG. 8 shows a positional relationship between the virtual dipole antenna 103 and the ventilation part 101. In Embodiment 2 as shown in FIG. 8, the virtual dipole antenna 103 is disposed at an angle of 60° relative to the ventilation part 101, which is different from Embodiment 1. The virtual dipole antenna 103 and the ventilation part 101 are arranged on the same horizontal plane. The virtual dipole antenna 103 is disposed at an angle of 60° relative to the ventilation part 101 on the horizontal plane. FIG. 6 shows dimensions of two holes in the ventilation part when the ventilation part 101 is seen from the virtual dipole antenna 103. In this case, due to the inclination of 60°, the horizontal dimension of each hole, seen from the virtual dipole antenna 103, is 2.5 cm. On the other hand, since the virtual dipole antenna 103 and the ventilation part 101 are arranged on the same horizontal plane, the total vertical dimension of the two holes remains 5 cm.

The frequency of the high frequency noise generated from the digital processing circuit 102 according to the Embodiment 2 is 4.45 GHz as in Embodiment 1. Accordingly, as in Embodiment 1, when the maximum length of the space of the ventilation part 101 is less than 3.37 cm, it is possible to suppress the high frequency noise from being received by the log periodic antenna 104 provided outside of the housing 100. As shown in FIG. 6, the bar 107 is horizontally disposed through the center of the ventilation part 101.

As described above, since the bar 107 is disposed through the center of the ventilation part 101, the maximum length of the space in each hole of the ventilation part 101 is, both in the horizontal direction and the vertical direction, less than ½ of the wavelength λ (=3.37 cm) of the high frequency noise.

According to Embodiment 2, in accordance with the change of the position of the digital processing circuit 102, the maximum length of the space of the ventilation part 101, as seen from the digital processing circuit 102, changes. This allows reduction of the number of bars, which are to be provided in the ventilation part 101 in order to suppress the high frequency noise from being radiated to the outside of the housing 100.

As described above, in Embodiment 2, when the frequency of the high frequency noise generated from the digital processing circuit 102 is 4.45 GHz and when the virtual dipole antenna 103 is disposed at an angle of 60° relative to the ventilation part 101, it is possible to suppress, by providing only the bar 107, the high frequency noise from being radiated to the outside of the housing 100. The relationship among the frequency of the high frequency noise, the maximum lengths in the vertical and the horizontal direction of the space in each hole of the ventilation part, and the angle at which the virtual dipole antenna 103 is disposed relative to the ventilation part in Embodiment 2 is expressed as follows.

It is assumed that the frequency of the high frequency noise is A Hz, the maximum length in the vertical direction of the space in each hole of the ventilation part is R1, the maximum length in the horizontal direction of the space in the hole of the ventilation part is R2, and the virtual dipole antenna 103 is disposed at an angle of θ° relative to the ventilation part, on the horizontal plane. In this case, the wavelength λ of the high frequency noise is $2.99792458\times10^8/A$.

Here, with respect to the vertical direction of the hole, the maximum length in the vertical direction of the hole of the ventilation part 101, as seen from the virtual dipole antenna 103, is R1. Meanwhile, with respect to the horizontal direction of the hole, the maximum length in the horizontal direction of the hole of the ventilation part 101, as seen from the virtual dipole antenna 103, is R2 cos θ.

With respect to the vertical direction, as in Embodiment 1, when the following formula (2) is satisfied, it is possible to suppress the high frequency noise from being radiated to the outside of the housing 100.

$$2.99792458\times10^8/A\times\tfrac{1}{2}>R1 \qquad \text{formula (2)}$$

On the other hand, with respect to the horizontal direction, different from Embodiment 1, when the following formula (3) is satisfied, it is possible to suppress the high frequency noise from being radiated to the outside of the housing 100.

$$2.99792458\times10^8/\text{frequency } A\times\tfrac{1}{2}>R2\cos\theta 2 \qquad \text{formula (3).}$$

As described above, the electronic apparatus according to Embodiment 2 includes a housing formed of a conductive material and an electronic circuit which is disposed in the housing and radiates an electromagnetic wave. The housing includes a ventilation part through which air is ventilated into and out of the housing. The ventilation part is divided into a plurality of holes by a conductive member. When the maximum length in the vertical direction of one of the plurality of holes that has the largest opening area is R1 m, and the maximum length in the horizontal direction in the one of the plurality of holes that has the largest opening area is R2 m, when the frequency of the electromagnetic wave in the vertical direction radiated from the electronic circuit is A Hz, and when an angle on the horizontal plane between the electromagnetic wave radiated from the electronic circuit toward the ventilation part and the ventilation part is θ°, a relationship expressed as $3.0\times10^8/A\times\tfrac{1}{2}>R1$ and $3.0\times10^8/A\times\tfrac{1}{2}>R2\cos\theta$ is satisfied.

As described above, by horizontally arranging the bar 107 through the center of the ventilation part 101, the maximum length of the space in each hole of the ventilation part 101 becomes 2.5 cm. Since the maximum length of each hole of the ventilation part 101 is less than 3.3 cm, the radiation of the high frequency noise through the ventilation part 101 is greatly suppressed. That is, in the electronic apparatus according to Embodiment 2, when compared with the electronic apparatus according to Embodiment 1, the position of the digital processing circuit 102 is changed. This allows reduction of the number of bars, which are to be provided in the ventilation part 101 in order to suppress the high frequency noise from being radiated to the outside of the housing 100. And, since the number of bars is small, it is further possible to improve the ventilation performance of the ventilation part 101.

It is noted that, in Embodiment 2, the vertical direction and the horizontal direction may be switched with each other. This means that the direction in which the high frequency noise travels is not limited, because the AV digital apparatus, which is an example of the electronic apparatus, may be disposed longitudinally or upright.

Further, in the above description of Embodiment 2, the virtual dipole antenna 103 is disposed at an angle of $\theta°$ on the horizontal plane relative to the ventilation part. However, the virtual dipole antenna 103 may be disposed at an angle of $\theta 1°$ on the vertical plane relative to the ventilation part and at an angle of $\theta 2°$ on the horizontal plane relative to the ventilation part. In this case, when the frequency of the electromagnetic wave in the vertical direction is A1 and the frequency of the electromagnetic wave in the horizontal direction is A2, the formula to be satisfied is expressed as follows:

$$3.0 \times 10^8 / A1 \times \frac{1}{2} > R1 \cos \theta 1$$

and $$3.0 \times 10^8 / A2 \times \frac{1}{2} > R2 \cos \theta 2 \text{ (including the case of } A1 = A2).$$

Such a case may be a case (A) where a high frequency noise generated from a noise source is composed of a vertical direction component (frequency A1) and a horizontal direction component (frequency A2) (the high frequency noise includes a vertical component and a horizontal component), or a case (B) where there are two high frequency noise sources, and one noise source generates a vertical high frequency noise (frequency A1) and the other noise source generates a horizontal high frequency noise (frequency A2).

Embodiment 3

Figure 9:
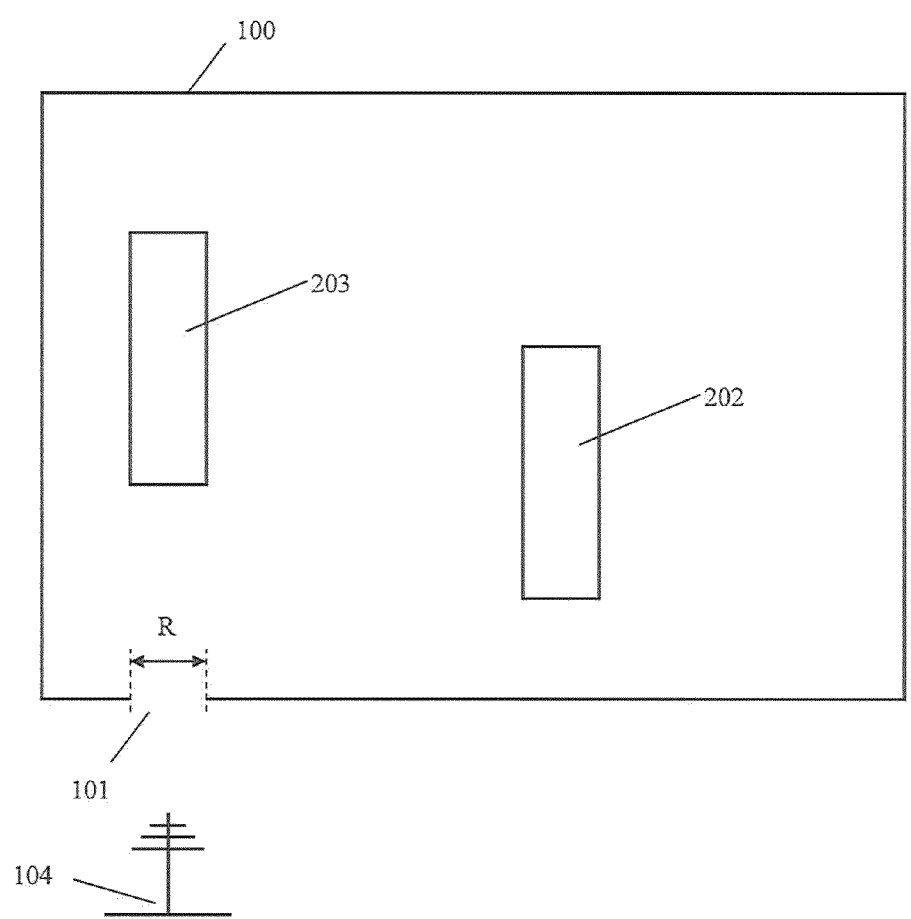
FIG. 9 shows a configuration of an electronic apparatus according to Embodiment 3 of the present invention.

In Embodiment 1 and Embodiment 2 described above, description is given of the case where one digital processing circuit 102 is provided, which is a noise source. In Embodiment 3, however, as shown in FIG. 9, a digital processing circuit 202 and a digital processing circuit 203 are provided, each generating a high frequency noise with a different frequency. The digital processing circuit 202 is a high frequency noise source which generates a high frequency noise with a frequency of 4.45 GHz, and is disposed at the same position as the digital processing circuit 102 described in Embodiment 2. Meanwhile, the digital processing circuit 203 is a high frequency noise source which generates a high frequency noise with a frequency of 3 GHz, and is disposed at the same position as the digital processing circuit 102 described in Embodiment 1.

In order to suppress radiation through the ventilation part 101 of the high frequency noise generated from the digital processing circuit 202, the bar 107 may be horizontally disposed through the center of the ventilation part 10 as described in Embodiment 2.

Meanwhile, in order to suppress the radiation through the ventilation part 101 of the high frequency noise generated from the digital processing circuit 203, it is necessary to satisfy the relationship represented by formula (1) as described in Embodiment 1:

$$R < 2.99792458 \times 10^8 / 3 \times 10^9 \times \frac{1}{2}$$

and $$R < 4.95 \text{ cm}.$$

Therefore, in the present embodiment, since the diameter of the ventilation part 101 is 5 cm, the bar 108 may be added in the vertical direction in addition to the bar 107 which is provided corresponding to the digital processing circuit 202.

That is, when there are a plurality of high frequency noises in the housing 100, the ventilation part 101 may be provided with bars such that each noise satisfies formula (1) and formula (3).

Other Embodiments

Other embodiments different from those described above will now be described. In the embodiments above, description has been given of high frequency noises with a frequency of 4.45 GHz and a frequency of 3 GHz, respectively, which are generated from the digital processing circuit. However, the present invention may be applied to a high frequency noise with a frequency other than these frequencies. Further, in a case where a high frequency noise has a plurality of frequencies, bars may be provided such that each frequency satisfies the conditions described in the above embodiments.

Still further, a high frequency noise may include a frequency, such as 10 MHz, which is not a frequency near 3 GHz or 4.45 GHz. In other words, the high frequency noise may include a noise that causes a low level of influence when the noise is radiated.

Still further, in the embodiments described above, the bar 107 and the bar 108 are disposed through the center of the ventilation part 101. However, the bar 107 and the bar 108 need not necessarily be disposed through the center of the ventilation part 101. That is, as long as the bar 107 and the bar 108 are disposed such that they satisfy formula (1) and formula (3), the positions of the bar 107 and the bar 108 are not limited.

Further, in the embodiments described above, it is assumed that each of the digital processing circuit 102, the digital processing circuit 202, and the digital processing circuit 203, each being a noise source, is the virtual dipole antenna 103 that is horizontally provided and generates a horizontal electromagnetic wave. However, the electromagnetic waves generated from the digital processing circuit 102, the digital processing circuit 202, and the digital processing circuit 203 are not limited to horizontal electromagnetic waves. Thus, the electromagnetic wave generated from each of the above digital processing circuits may be a horizontal electromagnetic wave or a vertical electromagnetic wave, or may include both a horizontal electromagnetic wave and a vertical electromagnetic wave. Still further, the number of noise sources is not limited. Regardless of the number of noise sources, the maximum length of the space (the number and the positions of bars) in each hole of the ventilation part 101 may be calculated, as described above, in accordance with the positional relationship between the noise sources and the ventilation part 101 and the frequencies of the noises generated from the noise sources.

It is noted that in the above embodiments, description is given of the maximum length of the space in each hole of the ventilation part 101, but not of the minimum length thereof. This is not because the minimum length is not limited (this does not mean the length in the horizontal direction or in the vertical direction of the space of the hole can be small without limitation), but rather because the essential technical feature of the present invention is that the maximum length in the horizontal direction or in the vertical direction of the space of the hole is determined based on the frequency of a high frequency noise. In addition to the above technical feature, it is necessary that the minimum length of the space of the hole is such a length that does not interfere with cooling performance of ventilation (too small a space suppresses ventilation and reduces cooling efficiency) and that maintains the strength of the housing (if a bar is too thin, the strength of the housing is reduced. Meanwhile, if a thin bar is switched to a thicker bar, the length in the horizontal direction and in the vertical direction of the space of the hole is reduced, accordingly).

Figure 10:
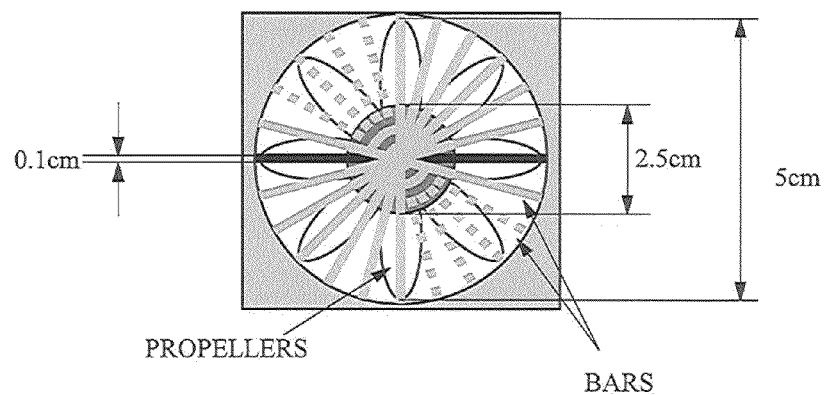
FIG. 10 shows a configuration of a conventional ventilation part.

FIG. 10 shows a conventional ventilation part. In general, the amount of wind passing through the ventilation part is determined in accordance with the area in which the propellers of a fan rotate (hereinafter referred to as propeller area). In the case of FIG. 10, the diameter of the circle representing the propeller area is 5 cm. In this case, 24 bars are provided in general.

The propeller area is: 2.5 cm×2.5 cm×π−1.25 cm×1.25 cm×π=14.7 cm². The area used by the bars in the propeller area is: 0.1 cm×(5 cm−2.5 cm)×24=6 cm².

In this case, the ventilation rate is: 100−(6/14.7)× 100=59%.

In the configuration of the conventional ventilation part includes bars in front of and in back of the propellers in the manner as shown in FIG. 10. In this case, the ventilation rate is: 0.59×0.59×100=34.8%, resulting in a poor ventilation rate.

Another case is described in which bars are provided in the manner as shown in FIG. 10 only on one side of the propellers and the bars described in the embodiments of the present invention are provided on the other side of the propellers. In a case where two bars are used as in the first embodiment, 100−((0.1×(5−2.5)×2)/14.7)×100=96.6%. In this case, the ventilation rate of the propeller area is: 59×96.6=57%. In this case, a sufficient ventilation rate is obtained.

In general, if the ventilation rate is about 50%, it can be said that the ventilation part does not suppress ventilation of air.

As described above, the configuration in which the high frequency noise is suppressed by use of bars as in the present invention is very effective in the following cases: when it is desired to limit the area used by bars as much as possible for the sake of the ventilation efficiency as in the case where a fan is provided near the ventilating hole, and especially when a fan (formed of resin) is projecting from the housing (when a fan is provided in the housing, the problem of limiting the area used by bars seldom occurs because the ventilating hole is provided with a fine mesh to prevent contact with impellers).

While the invention has been described in detail, the foregoing description is in all aspects illustrative and not restrictive. It will be understood that numerous other modifications and variations can be devised without departing from the scope of the invention.

What is claimed is:

1. An electronic apparatus comprising:
a housing formed of a conductive material; and
an electronic circuit which is disposed in the housing and which radiates an electromagnetic wave, wherein
the housing includes a ventilation part through which air is ventilated into and out of the housing,
the ventilation part is divided into a plurality of holes by a conductive member,
a maximum length in one of the vertical direction and the horizontal direction of one of the plurality of holes that has the largest opening area is less than the length of a half of the wavelength of the electromagnetic wave radiated from the electronic circuit, and
the ventilation part does not suppress ventilation of air.

2. The electronic apparatus according to claim 1, wherein the conductive member provided in the ventilation part has a configuration for maintaining the strength of the housing.

3. The electronic apparatus according to claim 1, wherein
when the maximum length in the one of the vertical direction and the horizontal direction in the one of the plurality of holes that has the largest opening area is R m, and
when the frequency of the electromagnetic wave radiated from the electronic circuit is A Hz,
a relationship expressed as $$3.0 \times 10^8 / A \times \frac{1}{2} > R$$

is satisfied.

4. The electronic apparatus according to claim 1, wherein
when the electronic circuit and the ventilation part are on an identical horizontal plane,
when the maximum length in the vertical direction in the one of the plurality of holes that has the largest opening area is R1 m, and the maximum length in the horizontal direction in the one of the plurality of holes that has the largest opening area is R2 m,
when the frequency of the electromagnetic wave radiated from the electronic circuit is A Hz, and
when an angle on the horizontal plane between the electromagnetic wave radiated from the electronic circuit toward the ventilation part and the ventilation part is θ°,
a relationship expressed as $$3.0 \times 10^8 / A \times \frac{1}{2} > R1$$

and $$3.0 \times 10^8 / A \times \frac{1}{2} > R2 \cos \theta$$

is satisfied.

5. The electronic apparatus according to claim 1, wherein
when the electronic circuit and the ventilation part are on an identical vertical plane,
when the maximum length in the vertical direction in the one of the plurality of holes that has the largest opening area is R1 [m], and the maximum length in the horizontal direction in the one of the plurality of holes that has the largest opening area is R2 [m],
when the frequency of the electromagnetic wave radiated from the electronic circuit is A Hz, and
when an angle on the vertical plane between the electromagnetic wave radiated from the electronic circuit toward the ventilation part and the ventilation part is θ°,
a relationship expressed as $$3.0 \times 10^8 / A \times \frac{1}{2} > R1 \cos \theta$$

and $$3.0 \times 10^8 / A \times \frac{1}{2} > R2$$

is satisfied.

6. The electronic apparatus according to claim 1, wherein
when the maximum length in the vertical direction in the one of the plurality of holes that has the largest opening area is R1 m, and the maximum length in the horizontal direction in the one of the plurality of holes that has the largest opening area is R2 m,
when the frequency of the electromagnetic wave in the vertical direction radiated from the electronic circuit is A1 Hz, and the frequency of the electromagnetic wave in the horizontal direction radiated from the electronic circuit is A2 Hz, and
when an angle on the vertical plane between the electromagnetic wave radiated from the electronic circuit toward the ventilation part and the ventilation part is θ1°, and an angle on the horizontal plane between the electromagnetic wave radiated from the electronic circuit toward the ventilation part and the ventilation part is θ2°, a relationship expressed as $$3.0 \times 10^8 / A \times \frac{1}{2} > R1 \cos \theta$$

and $$3.0 \times 10^8 / A \times \frac{1}{2} > R2 \cos \theta 2$$

is satisfied.

7. The electronic apparatus according to claim 6, wherein the electromagnetic wave is radiated from a single electromagnetic wave generation source and includes a horizontal component and a vertical component.

8. The electronic apparatus according to claim 6, wherein the electromagnetic wave includes an electromagnetic wave consisting of a horizontal component and an electromagnetic wave consisting of a vertical component that are radiated from a plurality of electromagnetic wave generation sources, respectively.

9. The electronic apparatus according to claim 1 further comprising a fan in the ventilation part for ventilating air.

* * * * *